United States Patent
Lee

(10) Patent No.: US 7,586,999 B2
(45) Date of Patent: Sep. 8, 2009

(54) METHOD AND RECEIVER FOR SCANNING BROADCAST CHANNELS

(75) Inventor: Che-Ming Lee, Shenzhen (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 560 days.

(21) Appl. No.: 11/308,573

(22) Filed: Apr. 8, 2006

(65) Prior Publication Data
US 2006/0276151 A1 Dec. 7, 2006

(30) Foreign Application Priority Data
Jun. 3, 2005 (CN) .................. 2005 1 0035136

(51) Int. Cl.
*H04L 27/00* (2006.01)
(52) U.S. Cl. ..................... 375/316; 375/345
(58) Field of Classification Search ................ 375/316, 375/324, 327, 344, 345; 455/136, 138
See application file for complete search history.

(56) References Cited

U.S. PATENT DOCUMENTS

| 5,729,611 A * | 3/1998 | Bonneville ................. 381/55 |
| 5,862,460 A * | 1/1999 | Rich .......................... 455/116 |
| 6,563,891 B1 * | 5/2003 | Eriksson et al. ............. 375/345 |
| 6,925,289 B2 | 8/2005 | Fukushima |
| 2002/0131533 A1 * | 9/2002 | Koizumi ..................... 375/345 |
| 2004/0087287 A1 * | 5/2004 | Abe ........................... 455/136 |
| 2005/0146643 A1 * | 7/2005 | Lee ............................ 348/678 |
| 2006/0217092 A1 * | 9/2006 | Zylowski .................... 455/136 |
| 2007/0030929 A1 * | 2/2007 | Gao et al. ................... 375/345 |
| 2007/0147553 A1 * | 6/2007 | Bhat et al. .................. 375/345 |
| 2007/0287400 A1 * | 12/2007 | Yu et al. .................. 455/232.1 |

* cited by examiner

*Primary Examiner*—Emmanuel Bayard
(74) *Attorney, Agent, or Firm*—Wei Te Chung

(57) ABSTRACT

A method of scanning channels for a digital broadcasting receiver includes: presetting a starting frequency, a time interval, a first threshold, and a second threshold; scanning a channel from the starting frequency; reading a first gain value of an IF signal from a buffer when the receiver begins to scan the channel; reading a second gain value of the IF signal from the buffer after the time interval has elapsed; determining whether a difference between the first value and the second value is less than or equal to the first threshold; determining whether the second value is less than or equal to the second threshold, if the difference between the first value and the second value is less than or equal to the first threshold; and the receiver moving on from the channel being currently scanned to scan a next channel, if the second value is greater than the second threshold.

14 Claims, 3 Drawing Sheets

METHOD AND RECEIVER FOR SCANNING BROADCAST CHANNELS

FIELD OF THE INVENTION

The present invention relates to a method and a receiver for scanning communications channels, and particularly to a method for fast channel scanning for a receiver such as a cable modem or a set top box.

DESCRIPTION OF RELATED ART

Digital video broadcasting providers often offer multiple television (TV) channels for their subscribers. A digital broadcasting receiver is used for receiving the television (TV) channel signals. The receiver often comprises a tuner and a main chip. The tuner scans the channels one by one to receive an input signal. In the tuner, the input signal is amplified, and is then converted into an intermediate frequency signal after the tuner synthesizes a local oscillator signal to combine with the input signal. Then the intermediate frequency signal is amplified and transmitted to the main chip, where it is determined whether a digital broadcasting signal exists on the channel.

Generally, the receiver takes at least 100 ms to finish the above-mentioned processes. If it is determined that the digital broadcasting signal does not exist on the channel, the receiver must spend a further 100 ms to determine whether a digital broadcasting signal exists on the next channel, and so on. All the channels must be scanned in successive order. Therefore, the receiver spends much time scanning channels that have no digital broadcasting signal.

SUMMARY OF INVENTION

An exemplary embodiment of the invention provides a method for scanning channels for a digital broadcasting receiver. The method comprises the steps of: providing a digital broadcasting receiver including a tuner for converting an input signal into an intermediate frequency (IF) signal; presetting a starting frequency, a time interval, a first threshold, and a second threshold; scanning a channel from the starting frequency; reading a first gain value of an IF signal from a buffer when the receiver begins to scan the channel; reading a second gain value of the IF signal from the buffer after the time interval has elapsed; determining whether a difference between the first value and the second value is less than or equal to the first threshold; determining whether the second value is less than or equal to the second threshold, if the difference between the first value and the second value is less than or equal to the first threshold; and the receiver moving on from the channel being currently scanned to scan a next channel, if the second value is greater than the second threshold.

Another exemplary embodiment of the invention provides a digital broadcasting receiver. The tuner comprises a tuner and a main chip. The tuner is used for scanning channels and receiving a radio frequency (RF) signal, and comprises a radio frequency amplifier for amplifying the RF signal; a radio frequency automatic gain controller (RF AGC) for amplifying the RF signal; a synthesizer for generating a local oscillatory signal; a mixer for mixing the RF signal and the local oscillatory signal generated by the synthesizer and converting the mixed signals into an intermediate frequency (IF) signal; an intermediate frequency amplifier, for receiving the IF signal from the mixer and amplifying the IF signal; and an intermediate frequency automatic gain controller (IF AGC) for amplifying the IF signal. The main chip is used for receiving the IF signal, determining whether a digital broadcasting signal exists on one of the channels, and demodulating the IF signal if a digital broadcasting signal exists on one of the channels.

A further exemplary embodiment of the invention provides a method for scanning channels for a digital broadcasting receiver. The method comprises: locating a signal channel on a signal receiver searchable from a preset start frequency of said signal receiver; retrieving signals from said located signal channel in said signal receiver; recording a first gain value of said signals at a first available time before a finish time of signal-processing on said signal channel in said signal receiver; recording a second gain value of said signals at a second available time later than said first available time and earlier than said finish time; and retrieving said signals continuously from said located signal channel for said signal-processing based on a comparative result of said first and second gain values with a preset threshold.

Other advantages and novel features will become more apparent from the following detailed description when taken in conjunction with the accompanying drawings, in which:

DETAILED DESCRIPTION

Figure 1:
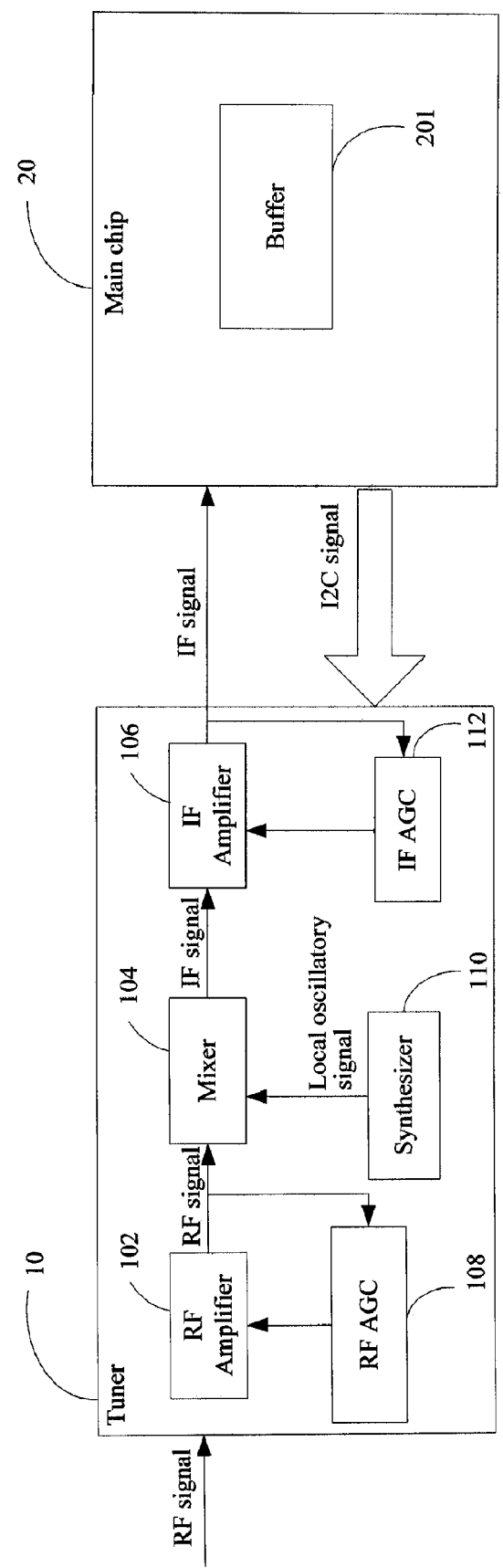
FIG. 1 is a block diagram of a digital broadcasting receiver of an exemplary embodiment of the invention.

FIG. 1 is a block diagram of a digital broadcasting receiver according to an exemplary embodiment of the present invention. In the embodiment, the receiver may be a modem, a set-top box, etc. The receiver comprises a tuner 10 and a main chip 20.

The tuner 10 comprises a Radio Frequency (RF) amplifier 102, a Radio Frequency Automatic Gain Controller (RF AGC) 108, a mixer 104, an Intermediate Frequency (IF) amplifier 106, an Intermediate Frequency Automatic Gain Controller (IF AGC) 112, and a synthesizer 110. The main chip 20 comprises a buffer 201.

The tuner 10 receives an RF signal. The RF signal is amplified by the RF amplifier 102 and the RF AGC 108, and then is transmitted to the mixer 104. The mixer 104 mixes the RF signal and a local oscillatory signal generated by the synthesizer 110, and converts the mixed signals into an IF signal. The IF signal is transmitted from the mixer 104 to the IF amplifier 106. The IF amplifier 106 and the IF AGC 112 amplify the IF signal, and transmit the IF signal to the main chip 20. In the main chip 20, the IF signal is demodulated.

A gain of each RF signal is different, and the gain may be large or small. Consequently, the time needed for the RF AGC 108 or IF AGC 112 to process the RF signal or the IF signal is variable. Accordingly, the gain of the IF signal recorded in the buffer 201 of the main chip 20 varies.

Figure 2:
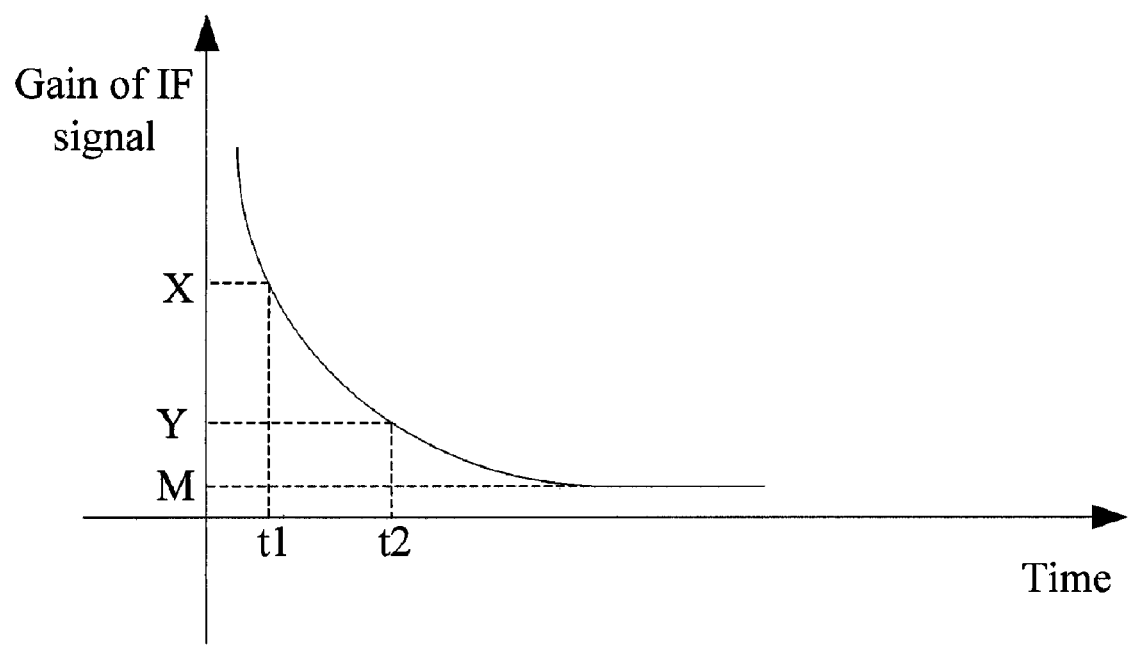
FIG. 2 is a graph showing a relationship between a variable gain of an IF signal with respect to time, according to exemplary embodiments of the invention.

As shown in FIG. 2, the main chip 20 reads a value X representing a gain of the IF AGC 112 stored in the buffer 201 at a time t1. After a time interval has elapsed, the main chip 20 reads a value Y representing a gain of the IF AGC 112 stored in the buffer 201 at a time t2. The time interval between t1 and t2 is a fixed value, and it is preset when the receiver is initialized. The main chip 20 determines whether a difference between the value X and the value Y is less than a predetermined first threshold. The first threshold is a decreasing rate of the IF signal gain before the IF signal becomes stabilized, and is not equal to zero. If the difference between the value X and the value Y is greater than the first threshold, the channel is carrying a digital broadcasting signal. The main chip 20 demodulates the digital broadcasting signal after the tuner 10 completes its scan of the channel. In the embodiment, the time interval for the tuner 10 to completely scan a channel is greater than or equal to 100 ms, and is greater than the time interval between t1 and t2.

When the tuner 10 is already tuned in to a channel, the IF signal may be stabilized, and the gain value of the IF signal will then be constant and equal to a designated value M. In this state, the difference between the value X and the value Y may be equal to or smaller than the first threshold. Thus the main chip 20 should determine whether the value Y is less than or equal to a second threshold, which is a minimum IF signal gain of the downstream channel. The second threshold may be a positive value or a negative value depending on the kind of receiver used. In the exemplary embodiment of the present invention, the minimum IF signal gain of the downstream channel is 0xcf00 (in dB).

If the value Y is less than or equal to the second threshold, the channel is carrying a digital broadcasting signal. The main chip 20 can demodulate the digital broadcasting signal after the tuner 10 finishes processing the digital broadcasting signal. If the value Y is greater than the second threshold, there is no digital broadcasting signal on the channel. The main chip 20 then sends an I2C (Inter-integrated Circuit) instruction signal to the tuner 10. Accordingly, the tuner 10 moves on from the channel currently being scanned to scan a next channel. Thus the tuner 10 scans the channels selectively, and the total time needed for the tuner 10 to scan the channels is effectively shortened.

Figure 3:
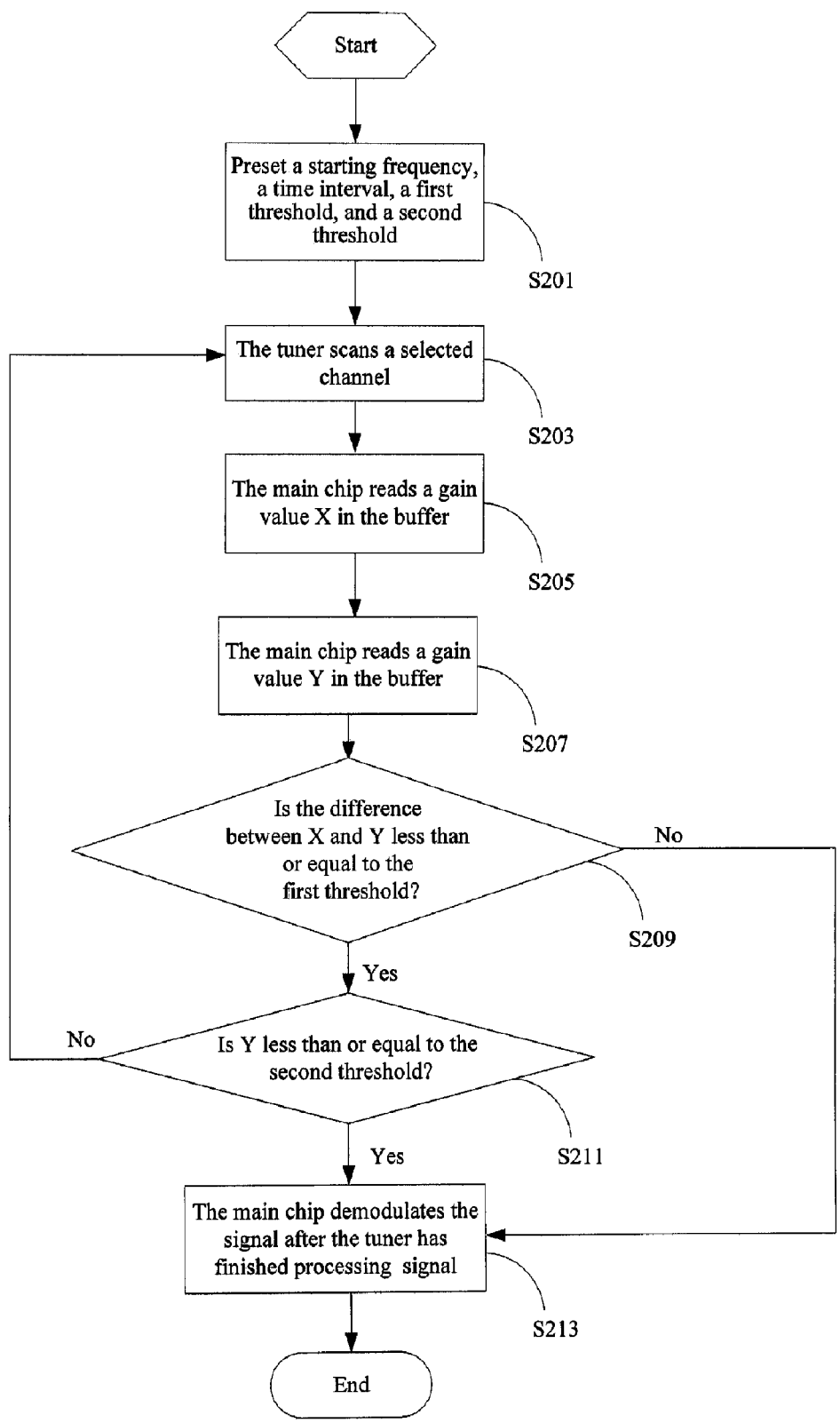
FIG. 3 is a flowchart of a method for scanning channels for a digital broadcasting receiver according to another exemplary embodiment of the invention.

FIG. 3 is a flowchart of a method for scanning channels for a digital broadcasting receiver. Typically, the method may be implemented using the receiver of FIG. 1. In step S201, the receiver presets a starting frequency for scanning channels, a time interval, a first threshold, and a second threshold. In the exemplary embodiment, the time interval is less than the time required for the IF AGC 112 to finish adjusting the gain of the IF signal, and also less than the time required for the synthesizer 110 to generate the local oscillatory signal.

The first and second thresholds may be varied according to the use and kind of the main chip 20. In the exemplary embodiment, the first threshold may be set for 0x0020, and the second threshold may be set for 0xcf00. The time interval may be set in the range from 10 ms to 20 ms.

In step S203, the tuner 10 scans a selected channel according to the starting frequency. In step S205, the main chip 20 reads a gain value X stored in the buffer 201. In the exemplary embodiment, the value X represents a gain of the IF signal at a time t1. In step S207, the main chip 20 reads a gain value Y stored in the buffer 201 after the time interval has elapsed. In step S209, the main chip 20 determines whether a difference between the value X and the value Y is less than or equal to the first threshold.

If the difference between the value X and the value Y is less than or equal to the first threshold, then in step S211, the main chip 20 determines whether the value Y is less than or equal to the second threshold.

If the value Y is less than or equal to the second threshold, a digital broadcasting signal exists on the channel. Accordingly, in step 213, the main chip 20 demodulates the digital broadcasting signal after the tuner 10 has finished processing the digital broadcasting signal.

If the value Y is greater than the second threshold, the channel does not have a digital broadcasting signal. Accordingly, the procedure returns to step S203. That is, the main chip 20 sends an I2C instruction signal to the tuner 10, and the tuner 10 moves on from the channel currently being scanned and scans a next selected channel.

If the difference between the value X and the value Y is less than the first threshold, there is a digital broadcasting signal on the channel. Accordingly, in step S213, the main chip 20 demodulates the digital broadcasting signal after the tuner 10 has finished processing the digital broadcasting signal.

While embodiments and methods have been described above, it should be understood that they have been presented by way of example only and not by way of limitation. Thus the breadth and scope of the present invention should not be limited by the above-described exemplary embodiments, but should be defined only in accordance with the following claims and their equivalents.

What is claimed is:

1. A method of scanning channels for a digital broadcasting receiver, the method comprising:
   providing a digital broadcasting receiver comprising a tuner for converting an input signal into an intermediate frequency (IF) signal;
   presetting a starting frequency, a time interval, a first threshold, and a second threshold, wherein the first threshold is a decreasing rate of the IF signal gain before the IF signal becomes stabilized, and wherein the second threshold is a minimum IF signal gain of a downstream channel when the IF signal becomes stabilized;
   scanning a channel from the staffing frequency;
   reading a first gain value of the IF signal from a buffer when the receiver begins to scan the channel;
   reading a second gain value of the IF signal from the buffer after the time interval has elapsed;
   determining whether a difference between the first gain value and the second gain value is less than or equal to the first threshold;
   determining whether the second gain value is less than or equal to the second threshold, if the difference between the first gain value and the second gain value is less than or equal to the first threshold; and
   the receiver moving on from the channel being currently scanned to scan a next channel, if the second gain value is greater than the second threshold.

2. The method of claim 1, wherein the receiver comprises a main chip comprising the buffer for storing the gain values of the IF signal.

3. The method of claim 2, further comprising the tuner processing the input signal and transmitting the IF signal to the main chip and the main chip demodulating the IF signal, if the second gain value is less than or equal to the second threshold.

4. The method of claim 2, further comprising the tuner processing the input signal and transmitting the IF signal to the main chip and the main chip demodulating the IF signal, if the difference between the first gain value and the second gain value is greater than the first threshold.

5. The method of claim 1, wherein the decreasing rate of the IF signal gain is determined according to the type of the receiver.

6. The method of claim 1, wherein the receiver comprises an IF automatic gain controller.

7. The method of claim 6, wherein the first gain value and the second gain value represent gains of the IF automatic gain controller at different times respectively.

8. The method of claim 6, wherein the time interval is less than a time required for the IF automatic gain controller to process the input signal completely.

9. The method of claim 1, wherein the receiver is a modem.

10. The method of claim 1, wherein the receiver is a set-top box.

11. A method of scanning signal channels for a signal receiver, comprising:
 locating a signal channel on a signal receiver searchable from a preset start frequency of said signal receiver;
 retrieving signals from said located signal channel in said signal receiver;
 recording a first gain value of said signals at a first available time before a finish time of signal-processing on said signal channel in said signal receiver;
 recording a second gain value of said signals at a second available time later than said first available time and earlier than said finish time; and
 retrieving said signals continuously from said located signal channel for said signal-processing based on a comparative result of said first and second gain values with a decreasing rate of said signal gain before said signals become stabilized and said second signal gain value with a minimum IF signal gain of a downstream channel when the IF signal becomes stabilized.

12. The method of claim 11, further comprising the step of locating another signal channel next to said located signal channel for said signal-processing based on another comparative result opposite to said comparative result.

13. The method of claim 11, wherein said comparative result is retrieved by comparing a difference between said first and second signal gain values with said decreasing rate of said signal gain before said signals become stabilized.

14. The method of claim 13, wherein said comparative result is further retrieved by comparing said second signal gain value with said minimum IF signal gain of the downstream channel when the IF signal becomes stabilized subsequently when said difference between said first and second signal gain values is verified as being not higher than said decreasing rate of said signal gain before said signals become stabilized.

* * * * *

UNITED STATES PATENT AND TRADEMARK OFFICE
CERTIFICATE OF CORRECTION

PATENT NO. : 7,586,999 B2 Page 1 of 1
APPLICATION NO. : 11/308573
DATED : September 8, 2009
INVENTOR(S) : Che-Ming Lee It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 713 days.

Signed and Sealed this

Twenty-first Day of September, 2010

David J. Kappos
*Director of the United States Patent and Trademark Office*